US012628540B2

(12) United States Patent
Zhu et al.

(10) Patent No.: US 12,628,540 B2
(45) Date of Patent: May 12, 2026

(54) ORGANIC LIGHT-EMITTING DISPLAY PANEL AND DISPLAY APPARATUS

(71) Applicant: HUAWEI TECHNOLOGIES CO., LTD., Shenzhen (CN)

(72) Inventors: Ming Zhu, Dongguan (CN); Huan Ni, Dongguan (CN); Feng Liao, Dongguan (CN); Xia Zhang, Dongguan (CN); Shenghe Luo, Dongguan (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 385 days.

(21) Appl. No.: 18/325,822

(22) Filed: May 30, 2023

(65) Prior Publication Data

US 2023/0309365 A1     Sep. 28, 2023

Related U.S. Application Data

(63) Continuation of application No. PCT/CN2021/122585, filed on Oct. 8, 2021.

(30) Foreign Application Priority Data

Nov. 30, 2020    (CN) .......................... 202011380685.9

(51) Int. Cl.
   *H10K 59/35*        (2023.01)
   *H10K 59/12*        (2023.01)
      (Continued)

(52) U.S. Cl.
   CPC ......... *H10K 59/8792* (2023.02); *H10K 59/35* (2023.02); *H10K 59/873* (2023.02); *H10K 59/8731* (2023.02); *H10K 59/879* (2023.02)

(58) Field of Classification Search
   CPC .. H10K 59/8792; H10K 59/35; H10K 59/873; H10K 59/8731; H10K 59/879;
      (Continued)

(56) References Cited

U.S. PATENT DOCUMENTS

2019/0258164 A1    8/2019  Tanigaki et al.
2020/0133414 A1*   4/2020  Lee .......................... G06F 3/044
                   (Continued)

FOREIGN PATENT DOCUMENTS

CN        108987447 A    12/2018
CN        108987451 A    12/2018
                   (Continued)

OTHER PUBLICATIONS

KR 20210157947 A (Year: 2021) Woo; Google Machine Translation Priority Date Jun. 22, 2020.*

*Primary Examiner* — Omar F Mojaddedi
(74) *Attorney, Agent, or Firm* — Leydig, Voit & Mayer, Ltd.

(57) ABSTRACT

Embodiments of this application provide an organic light-emitting display panel and a display apparatus. A functional layer disposed on a first substrate in the organic light-emitting display panel includes an emissive layer and an optical filter layer. A pixel define layer is disposed between adjacent organic light-emitting units in the emissive layer. Black light-shielding blocks and color-blocking blocks in the optical filter layer are alternately arranged. The color-blocking blocks and the organic light-emitting units are disposed in a one-to-one correspondence manner. A region between adjacent black light-shielding blocks covers the organic light-emitting unit in a thickness direction of the organic light-emitting display panel. The pixel define layer is a black light-absorbing layer. The black light-shielding blocks and the color-blocking blocks in the organic light-emitting display panel and the display apparatus provided in embodiments of this application, may cooperate to reduce transmission of visible light from an external environment to an internal film layer of the organic light-emitting display panel, and allow light emitted by the organic light-emitting unit to pass through. Therefore, a reflectivity of the organic
(Continued)

light-emitting display panel to external ambient light is reduced, and luminance of the organic light-emitting display panel is not reduced.

20 Claims, 12 Drawing Sheets

(51) Int. Cl.
  *H10K 59/38* (2023.01)
  *H10K 59/80* (2023.01)

(58) Field of Classification Search
  CPC .. H10K 59/122; H10K 59/126; H10K 59/352; H10K 59/38
  See application file for complete search history.

(56) References Cited

U.S. PATENT DOCUMENTS

| | | | |
|---|---|---|---|
| 2021/0210019 A1* | 7/2021 | Han | H10K 59/131 |
| 2021/0249486 A1* | 8/2021 | Lee | H10K 59/8792 |
| 2021/0399068 A1* | 12/2021 | Kim | H10K 59/8792 |
| 2021/0399262 A1* | 12/2021 | Woo | H10K 59/40 |

FOREIGN PATENT DOCUMENTS

| | | | | |
|---|---|---|---|---|
| CN | 109119453 A | 1/2019 | | |
| CN | 109638177 A | 4/2019 | | |
| CN | 109888130 A | 6/2019 | | |
| CN | 110085762 A | 8/2019 | | |
| CN | 110323353 A | 10/2019 | | |
| CN | 110335957 A | 10/2019 | | |
| CN | 111108602 A | 5/2020 | | |
| KR | 20210157947 A | * | 12/2021 | H10K 59/8791 |
| WO | 2013047621 A1 | 4/2013 | | |

* cited by examiner

001

ORGANIC LIGHT-EMITTING DISPLAY PANEL AND DISPLAY APPARATUS

CROSS-REFERENCE TO RELATED APPLICATIONS

This application is a continuation of International Application No. PCT/CN2021/122585, filed on Oct. 8, 2021, which claims priority to Chinese Patent Application No. 202011380685.9, filed on Nov. 30, 2020. The disclosures of the aforementioned applications are hereby incorporated by reference in their entireties.

TECHNICAL FIELD

This application relates to the field of display technologies, and in particular, to an organic light-emitting display panel and a display apparatus.

BACKGROUND

Organic light-emitting displays are increasingly widely used in fields such as mobile communications and wearable products, so that research on the organic light-emitting displays becomes a hot topic. The organic light-emitting display includes laminated electrode layers such as a metal layer. Therefore, if the organic light-emitting display is directly exposed to ambient light, strong reflection of the ambient light on the electrode layers such as the metal layer causes a decrease in a contrast of the organic light-emitting display, and even causes a failure in observing a displayed image.

In the conventional technologies, to resolve an impact of the light reflection on the contrast of the organic light-emitting display, a polarizer is disposed on an out-light surface of the organic light-emitting display. Because the polarizer can absorb light in one polarization direction and allow light in only another polarization direction to pass through, the polarizer can prevent a part of the ambient light from being transmitted to an internal film layer of the organic light-emitting display, thereby implementing effect of reducing reflected light. However, the polarizer disposed on the out-light surface of the organic light-emitting display not only absorbs the ambient light, but also absorbs light that is emitted by a light-emitting device in the organic light-emitting display and that is used for display. As a result, luminous efficacy of the organic light-emitting display is reduced, and consequently, luminance of the organic light-emitting display is reduced, or a service life of the light-emitting device in the organic light-emitting display is shortened.

SUMMARY

This application provides an organic light-emitting display panel and a display apparatus, to resolve the foregoing problems.

According to a first aspect, this application provides an organic light-emitting display panel, including a first substrate. A functional layer is disposed on the first substrate. The functional layer includes an emissive layer and an optical filter layer. The optical filter layer is disposed on a side that is of the emissive layer and that is close to an out-light surface of the organic light-emitting display panel. The emissive layer includes a plurality of organic light-emitting units and a pixel define layer. The pixel define layer is disposed between adjacent organic light-emitting units.

The optical filter layer includes a plurality of color-blocking blocks and a plurality of black light-shielding blocks. The black light-shielding blocks and the color-blocking blocks are alternately arranged. The color-blocking blocks and the organic light-emitting units are disposed in a one-to-one correspondence manner. A region between disposed adjacent black light-shielding blocks covers the organic light-emitting unit in a thickness direction of the organic light-emitting display panel. The pixel define layer is a black light-absorbing layer. In the organic light-emitting display panel provided in this embodiment of this application, the black light-shielding blocks are disposed above the organic light-emitting layer, and the color-blocking blocks are disposed above the organic light-emitting units. In this way, the black light-shielding blocks and the color-blocking blocks may cooperate to allow transmission of only visible light with a specified wavelength from an external environment to an internal film layer of the organic light-emitting display panel, that is, to reduce transmission of visible light from the external environment to the internal film layer of the organic light-emitting display panel. Therefore, a reflectivity of the organic light-emitting display panel to external ambient light is reduced, and a contrast of the organic light-emitting display panel is improved. In addition, because the color-blocking blocks are used to filter the external ambient light, and the color-blocking block may allow light emitted by a corresponding organic light-emitting unit to pass through, luminance of the organic light-emitting display panel is not reduced.

In an implementation of the first aspect, the pixel define layer and the black light-shielding blocks are infrared-transparent black light-absorbing layers. The pixel define layer and the black light-shielding blocks are disposed as the infrared-transparent black light-absorbing layer, so that the visible light from the external environment can be prevented from being transmitted to the organic light-emitting display panel, thereby reducing reflection of the external ambient light on the organic light-emitting display panel. In addition, due to allowance for infrared light to pass through, it can be ensured that the organic light-emitting display panel can collect an optical image through emitting or receiving infrared light.

In an implementation of the first aspect, the organic light-emitting display panel further includes a drive circuit layer and a planarization layer. The planarization layer is disposed between the drive circuit layer and the emissive layer. The drive circuit layer includes a plurality of transistor structures. The planarization layer is a black light-absorbing layer. The planarization layer is also disposed as the black light-absorbing layer, to further reduce a probability that the visible light from the external environment is transmitted to the internal film layer of the organic light-emitting display panel and is reflected, thereby further improving resolution of the organic light-emitting display panel.

In an implementation of the first aspect, the planarization layer is an infrared-transparent black light-absorbing layer. The planarization layer is also disposed as the infrared-transparent black light-absorbing layer. In this way, it can also be ensured that infrared light can pass through the organic light-emitting display panel, and it can be ensured that the organic light-emitting display panel can collect an optical image through emitting or receiving infrared light.

In an implementation of the first aspect, the pixel define layer under the black light-shielding blocks is a discontinuous structure in the thickness direction of the organic light-emitting display panel. When the pixel define layer is not disposed at at least some locations under the black light-shielding blocks, transmittance for detect light such as infrared light is increased, to improve precision of collecting an optical image. In addition, because there are the black light-shielding blocks at the at least some locations, transmission and reflection of the external ambient light can still be effectively reduced.

In an implementation of the first aspect, in a plane perpendicular to the thickness direction of the organic light-emitting display panel, a minimum distance between an edge of the organic light-emitting unit and an edge of the corresponding region between adjacent black light-shielding blocks is a first distance, and the first distance is greater than 0.5 μm. In an implementation of the first aspect, the plurality of organic light-emitting units include a green organic light-emitting unit, a blue organic light-emitting unit, and a red organic light-emitting unit. The first distance corresponding to the green organic light-emitting unit is 3 μm, the first distance corresponding to the blue organic light-emitting unit is 1.5 μm, and the first distance corresponding to the red organic light-emitting unit is 5 μm. Matching is properly performed among the first distances respectively corresponding to the green organic light-emitting unit, the blue organic light-emitting unit, and the red organic light-emitting unit, so that luminance consistency of subpixels with different colors at a same viewing angle can be improved, thereby avoiding a color cast problem. In addition, in this embodiment of this application, because the black light-absorbing pixel define layer is used, when the first distance is properly increased, a relatively small reflectivity of the organic light-emitting display panel to the external ambient light can still be ensured.

In an implementation of the first aspect, the plurality of organic light-emitting units include a green organic light-emitting unit, a blue organic light-emitting unit, and a red organic light-emitting unit; and the plurality of color-blocking blocks include a green color-blocking block, a blue color-blocking block, and a red color-blocking block. The green organic light-emitting unit is disposed in a correspondence with the green color-blocking block, the blue organic light-emitting unit is disposed in a correspondence with the blue color-blocking block, and the red organic light-emitting unit is disposed in a correspondence with the red color-blocking block. A full width at half maximum of an optical spectrum of the green color-blocking block is less than or equal to 70 nm, a full width at half maximum of an optical spectrum of the blue color-blocking block is greater than or equal to 60 nm and less than or equal to 100 nm, and a full width at half maximum corresponding to a short wavelength of an optical spectrum of the red color-blocking block is less than or equal to 25 nm. Wavelength ranges of light allowed to pass through the green color-blocking block and the red color-blocking block are narrowed, so that intensity of the external ambient light reaching an anode in a light-emitting device through the green color-blocking block and the red color-blocking block is reduced. In this way, reflection of the external ambient light on the organic light-emitting display panel can be effectively reduced, and chrominance of red light and green light emitted by the organic light-emitting display panel can be improved. The full width at half maximum of the blue color-blocking block is widened, so that transmittance of the blue color-blocking block can be improved. In this way, luminance of a blue subpixel can be properly improved, and a service life of the blue subpixel can be further prolonged.

In an implementation of the first aspect, the organic light-emitting display panel further includes an encapsulation layer, a first planarization layer, a second planarization layer, and a coating planarization layer. The encapsulation layer is disposed between the emissive layer and the first planarization layer, and includes a first inorganic insulation layer, an organic insulation layer, and a second inorganic insulation layer. The organic insulation layer is disposed between the first inorganic insulation layer and the second inorganic insulation layer. The second inorganic insulation layer is disposed on a side that is of the organic insulation layer and that is close to the first planarization layer. At least one of the color-blocking block and the black light-shielding block is located between the first planarization layer and the second planarization layer. The second planarization layer is disposed on a side that is of the first planarization layer and that is close to the coating planarization layer. A refractive index of the second inorganic insulation layer, a refractive index of the first planarization layer, a refractive index of the second planarization layer, and a refractive index of the coating planarization layer sequentially decrease. Matching may be performed among refractive indexes of the optical filter layer, the encapsulation layer, and the coating planarization layer, so that the reflectivity of the organic light-emitting display panel to the external ambient light can be reduced and luminous efficacy for displayed light of the organic light-emitting display panel can be improved.

In an implementation of the first aspect, the refractive index of the second inorganic insulation layer is 1.8, the refractive index of the first planarization layer is 1.62, the refractive index of the second planarization layer is 1.55, and the refractive index of the coating planarization layer is 1.52. After matching is performed among the refractive indexes of the optical filter layer, the encapsulation layer, and the coating planarization layer based on the foregoing values of the refractive indexes, a contribution of the optical filter layer to the reflectivity of the organic light-emitting display panel to the external ambient light is approximately reduced to 0.2%. In this way, the reflection of the external ambient light on the organic light-emitting display panel is further reduced.

According to a second aspect, this application provides a display apparatus, including the organic light-emitting display panel provided in the first aspect. In the display apparatus provided in this embodiment of this application, black light-shielding blocks are disposed above an organic light-emitting layer, and color-blocking blocks are disposed above organic light-emitting units. In this way, the black light-shielding blocks and the color-blocking blocks may cooperate to allow transmission of only visible light with a specified wavelength from an external environment to an internal film layer of the organic light-emitting display panel, that is, to reduce transmission of visible light from the external environment to the internal film layer of the organic light-emitting display panel. Therefore, a reflectivity of the organic light-emitting display panel to external ambient light is reduced, and a contrast of the display apparatus is improved. In addition, because the color-blocking blocks are used to filter the external ambient light, and the color-blocking block may allow light emitted by a corresponding organic light-emitting unit to pass through, luminance of the display apparatus is not reduced.

DESCRIPTION OF EMBODIMENTS

Terms used in embodiments of this application are merely used to explain specific embodiments of this application, but are not intended to limit this application.

Embodiments of this application provide an organic light-emitting display panel and a display apparatus.

Figure 1:
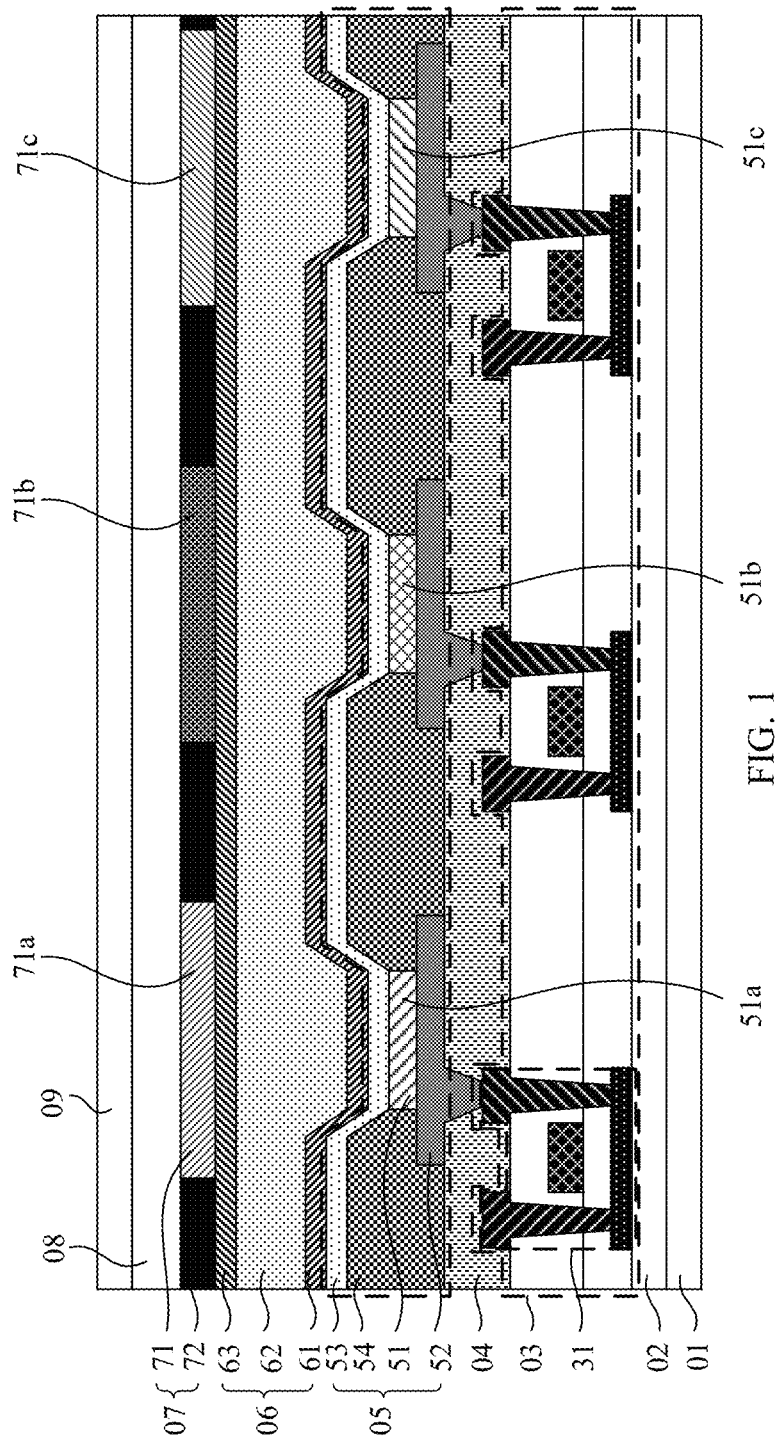
FIG. 1 is a schematic diagram of an organic light-emitting display panel according to an embodiment of this application.

FIG. 1 is a schematic diagram of an organic light-emitting display panel according to an embodiment of this application. As shown in FIG. 1, the organic light-emitting display panel provided in this embodiment of this application includes a first substrate 01 and a second substrate 09. The first substrate 01 and the second substrate 09 are disposed opposite to each other. A functional layer is disposed on a side that is of the first substrate 01 and that faces the second substrate 09. A surface coating planarization layer 08 is disposed between the functional layer and the second substrate 09. The first substrate 01 is configured to bear the functional layer. The second substrate 09 is configured to encapsulate and protect the functional layer.

The functional layer disposed on the first substrate 01 includes a drive circuit layer 03, an emissive layer 05, and an optical filter layer 07. The drive circuit layer 03, the emissive layer 05, and the optical filter layer 07 are sequentially disposed in a direction from the first substrate 01 to the second substrate 09.

The emissive layer 05 includes a plurality of light-emitting devices. The plurality of light-emitting devices are in a one-to-one correspondence with subpixels on the organic light-emitting display panel. The light-emitting devices may be specifically organic light-emitting devices, and are configured to emit light for display. The drive circuit layer 03 includes a plurality of transistor structures 31. At least two transistor structures 31 may form a pixel driver circuit. At least one transistor structure 31 in the pixel driver circuit is electrically connected to the light-emitting device. The pixel driver circuit may provide a voltage or a current that is required for light emission performed by the light-emitting device at the emissive layer 05. The optical filter layer 07 may be configured to: filter light emitted by the light-emitting device at the emissive layer 05 to implement color display, and block light between adjacent subpixels to avoid optical crosstalk between different subpixels.

In addition, a buffer layer 02 may be included between the drive circuit layer 03 and the first substrate 01. The buffer layer 02 may protect a semiconductor layer in the transistor structure 31 from being damaged by external vapor, oxygen, and the like. A planarization layer 04 may be disposed between the emissive layer 05 and the drive circuit layer 03. The planarization layer 04 covers the drive circuit layer 03, and provides a flat surface for preparing the emissive layer 05. An encapsulation layer 06 may be disposed between the optical filter layer 07 and the emissive layer 05. The encapsulation layer 06 may protect an organic light-emitting material in the emissive layer 05 from being damaged by water vapor, oxygen, and the like. In addition, the encapsulation layer 06 may specifically include a first inorganic insulation layer 61, an organic insulation layer 62, and a second inorganic insulation layer 63 that are sequentially laminated in a thickness direction of the organic light-emitting display panel.

In this embodiment of this application, the optical filter layer 07 and the emissive layer 05 are both disposed on the first substrate 01. In this case, after different colors of light emitted by different light-emitting devices pass through the optical filter layer 07, purity of different colors of light can be improved. In addition, when external ambient light is to be transmitted to the drive circuit layer 03 and the emissive layer 05 that includes a conducting layer containing a relatively large amount of metal, the external ambient light also needs to pass through the optical filter layer 07. In this case, the optical filter layer 07 may block visible light from an external environment to avoid transmission of the visible light to a region between adjacent subpixels. In addition, the optical filter layer 07 may allow transmission of only visible light with a specified wavelength from the external environment to a region in which a subpixel is located. Therefore, light transmitted to the organic light-emitting display panel is reduced, and reflection of the external ambient light on the display panel.

An aperture ratio of a small-sized top-emission organic light-emitting display panel is relatively small and approximately ranges from 15% to 20%. To reduce transmission of the visible light from the external environment to the organic light-emitting display panel without weakening display light emitted by the light-emitting device, in this embodiment of this application, a polarizer in the conventional technologies is replaced with the optical filter layer 07 in the organic light-emitting display panel, to prevent external ambient light with some wavelengths from being transmitted to the organic light-emitting display panel. The polarizer is replaced with the optical filter layer 07, thereby avoiding a problem that luminance of light emitted by the organic light-emitting display panel is reduced due to use of the polarizer. In addition, the following case can be avoided: The external ambient light is transmitted to the organic light-emitting display panel and is reflected by the organic light-emitting display panel.

Still with reference to FIG. 1, in the thickness direction of the organic light-emitting display panel, the emissive layer 05 specifically includes an organic light-emitting layer 51, a first electrode layer 52, a second electrode layer 53, and a pixel define layer 54.

The organic light-emitting layer 51 includes a plurality of organic light-emitting units. The organic light-emitting unit is made of an organic light-emitting material. Different organic light-emitting units correspond to different subpixels. A film layer configured to emit light in the light-emitting device is specifically an organic light-emitting unit. The plurality of organic light-emitting units include a green organic light-emitting unit 51a, a blue organic light-emitting unit 51b, and a red organic light-emitting unit 51c. Organic light-emitting units corresponding to different colors of emitted light are made of different organic light-emitting materials, and can emit different colors of light.

In an implementation of this application, the first electrode layer 52 may be made of a metal material and disposed on a side that is of the organic light-emitting layer 51 and that is close to the first substrate 01. The first electrode layer 52 includes a plurality of electrically insulated anodes. Different organic light-emitting units correspond to different anodes. The second electrode layer 53 may be made of a transparent conducting material and disposed on a side that is of the organic light-emitting layer 51 and that is close to the second substrate 02. The second electrode layer 53 includes cathodes. Cathodes of different subpixels may be electrically connected to each other to form a front-side structure. In one subpixel, in the thickness direction of the organic light-emitting display panel, the light-emitting device includes an anode, an organic light-emitting unit, and a cathode that are laminated, and the pixel drive circuit may be specifically electrically connected to the anode. Anodes in light-emitting devices corresponding to different subpixels are electrically insulated.

Still with reference to FIG. 1, the pixel define layer 54 is disposed between adjacent organic light-emitting units. As shown in FIG. 1, the pixel define layer 54 is included between the green organic light-emitting unit 51a and the blue organic light-emitting unit 51b that are adjacent to each other, and the pixel define layer 54 is also included between the blue organic light-emitting unit 51b and the red organic light-emitting unit 51c that are adjacent to each other.

Still with reference to FIG. 1, the optical filter layer 07 includes a plurality of color-blocking blocks 71 and a black light-shielding matrix. The black light-shielding matrix includes a plurality of black light-shielding blocks 72, to selectively filter light with different wavelengths that passes through the optical filter layer 07. At the optical filter layer 07, in addition to a location of a through hole that passes through the optical filter layer 07, the black light-shielding blocks 72 and the color-blocking blocks 71 are alternately arranged.

Regions between adjacent black light-shielding blocks 72 are disposed in a one-to-one correspondence with a plurality of subpixels of the organic light-emitting display panel. The region between adjacent black light-shielding blocks 72 corresponds to a subpixel region of the organic light-emitting display panel. The black light-shielding blocks 72 in the black light-shielding matrix may prevent visible light from passing through, thereby avoiding optical crosstalk between adjacent subpixels.

The color-blocking blocks 71 are disposed in a one-to-one correspondence with the organic light-emitting units. The color-blocking block 71 is disposed on a side that is of the corresponding organic light-emitting unit and that is close to an out-light surface of the organic light-emitting display panel. Different subpixels correspond to different color-blocking blocks 71. For one subpixel, an organic light-emitting unit may independently emit light, and the light emitted by the organic light-emitting unit is transmitted to the outside after passing through a corresponding color-blocking block 71.

The plurality of color-blocking blocks 71 include a green color-blocking block 71a disposed in a correspondence with the green organic light-emitting unit 51a, a blue color-blocking block 71b disposed in a correspondence with the blue organic light-emitting unit 51b, and a red color-blocking block 71c disposed in a correspondence with the red organic light-emitting unit 51c. Therefore, the green color-blocking block 71a may filter green light emitted by a light-emitting device corresponding to the green organic light-emitting unit 51a, so that green light emitted by a green subpixel has purer chrominance; the blue color-blocking block 71b may filter blue light emitted by a light-emitting device corresponding to the blue organic light-emitting unit 51b, so that blue light emitted by a blue subpixel has purer chrominance; and the red color-blocking block 71c may filter red light emitted by a light-emitting device corresponding to the red organic light-emitting unit 51c, so that red light emitted by a red subpixel has purer chrominance.

Figure 2:
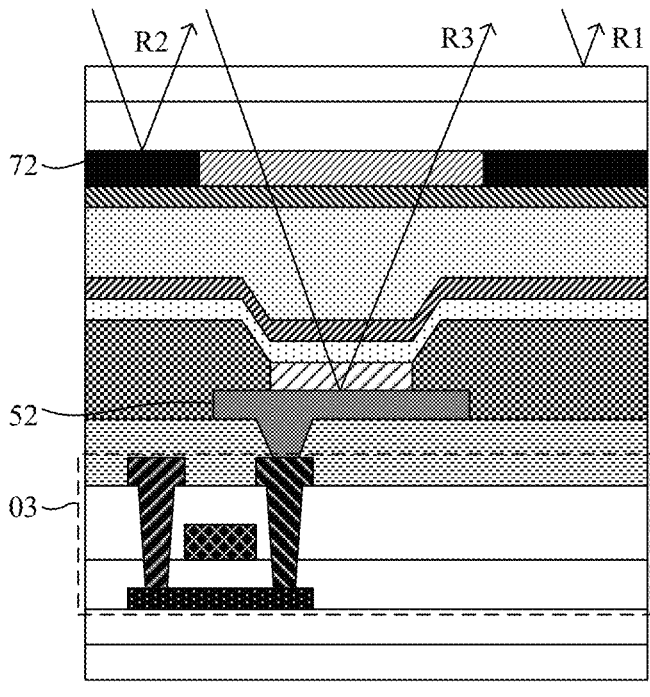
FIG. 2 is a schematic diagram of light reflection on an organic light-emitting display panel according to an embodiment of this application.

FIG. 2 is a schematic diagram of light reflection on an organic light-emitting display panel according to an embodiment of this application. When a polarizer is replaced with the optical filter layer 07 in the organic light-emitting display panel to reduce visible light transmitted to the organic light-emitting display panel and further reduce reflection of ambient light on the organic light-emitting display panel, a reflectivity of the organic light-emitting display panel to the ambient light may reach a level less than or equal to 6%. Specifically, as shown in FIG. 2, an interfacial reflectivity between the second substrate 09 and the air is a first reflectivity R1, where R1 is approximately 4%; an interfacial reflectivity between the optical filter layer 07 and the coating planarization layer 08 is a second reflectivity R2, where R2 is approximately 0.3%; and a reflectivity of the light-emitting device is a third reflectivity R3, where R3 is approximately 1.5%. It should be noted that the third reflectivity R3 is mainly contributed by the anode made of the metal material in the light-emitting device, and a conducting metal structure of the transistor structure 31 in the drive circuit layer 03 and a metal wire electrically connected to the transistor structure 31 are usually disposed under a shielding part 721 of the black matrix layer 72 with a sufficiently high light density and therefore basically does not reflect the ambient light.

Due to limitation of process precision, there is a size deviation between a design phase and a preparation process for the black light-shielding block 72 and the color-blocking block 71. As a result, there is an alignment deviation among a region between adjacent black light-shielding blocks 72, the color-blocking block 71, and the corresponding organic light-emitting unit 51a/51b/51c. When a size of the region between adjacent black light-shielding blocks 72, a size of the color-blocking block 71a/71b/71c, and a size of the corresponding organic light-emitting unit 51a/51b/51c are equivalent in a design phase, in a preparation process, the following risk exists: An edge of the black light-shielding block 72 and an edge of the color-blocking block 71a/71b/71c are indented relative to an edge of the organic light-emitting unit 51a/51b/51c. Although the third reflectivity R3 can be reduced in this case, the aperture ratio of the organic light-emitting display panel is reduced, thereby further reducing display luminance or increasing power consumption and shortening a service life of the organic light-emitting unit. Therefore, to ensure the aperture ratio, the size of the region between black light-shielding blocks 72 and the size of the color-blocking block 71a/71b/71c may be designed to be greater than the size of the organic light-emitting unit 51a/51b/51c.

In this embodiment of this application, the pixel define layer 54 is a black light-absorbing layer. In other words, the pixel define layer 54 is made of a material that absorbs visible light. In this embodiment of this application, the optical filter layer 07 may be used to alleviate a light reflection phenomenon caused when the external ambient light is transmitted to the organic light-emitting display panel. However, because the black light-shielding blocks 72 can block only external ambient light transmitted from an upper side of the black light-shielding blocks 72, there is still external ambient light passing through the optical filter layer 07 in a region other than the black light-shielding blocks 72 in the organic light-emitting display panel. The black light-absorbing pixel define layer 54 is disposed to further reduce transmission of the external ambient light to the internal film layer of the organic light-emitting display panel and is further reflected.

Still with reference to FIG. 1, in one subpixel, an area of the region between adjacent black light-shielding blocks 72 and an area of the color-blocking block 71 are actually greater than an area of the organic light-emitting unit 51a/51b/51c. Because light emitted by the organic light-emitting unit 51a/51b/51c has a specific angle, to ensure the aperture ratio of the organic light-emitting display panel, the area of the region between adjacent black light-shielding blocks 72 and the area of the color-blocking block 71a/71b/71c are greater than the area of the organic light-emitting unit 51a/51b/51c corresponding to the subpixel, that is, an area of the subpixel. In this case, in the thickness direction of the organic light-emitting display panel, the region between adjacent black light-shielding blocks 72 covers the corresponding organic light-emitting unit 51a/51b/51c. Because the area of the color-blocking block 71a/71b/71c is greater than the area of the organic light-emitting unit 51a/51b/51c corresponding to the color-blocking block 71a/71b/71c, and visible light with a specific wavelength still passes through after the external ambient light is filtered by the color-blocking block 71a/71b/71c, the emissive layer 05 and the pixel define layer 54 are disposed under the color-blocking block 71a/71b/71c in the thickness direction of the organic light-emitting display panel. The black light-absorbing pixel define layer 54 is disposed in another region other than the light-emitting device. In this case, the pixel define layer 54 can prevent the external ambient light passing through the color-blocking block 71a/71b/71c from being transmitted to another film layer under the pixel define layer 54, thereby reducing light reflection on the another film layer.

As shown in FIG. 1, an area of the anode included in the first electrode layer 52 and an area of the cathode included in the second electrode layer 53 are both greater than the area of the organic light-emitting unit 51a/51b/51c located between the anode and the cathode, to ensure that a light-emitting area of the organic light-emitting unit is maximized. In this case, in addition to a part disposed under the organic light-emitting unit 51a/51b/51c, the anode prepared by using metal further includes a part disposed outside a region in which the organic light-emitting unit 51a/51b/51c is located. The pixel define layer 54 further covers the part that is of the anode and that is disposed outside the region in which the organic light-emitting unit 51a/51b/51c is located, so that the external ambient light passing through the color-blocking block 71a/71b/71c can be prevented from being transmitted to the anode outside the region in which the organic light-emitting unit 51a/51b/51c is located, thereby reducing light reflection on the anode. In other words, in this embodiment of this application, the light reflectivity of the organic light-emitting display panel to the external ambient light can be reduced through reducing the third reflectivity R3.

Figure 3:
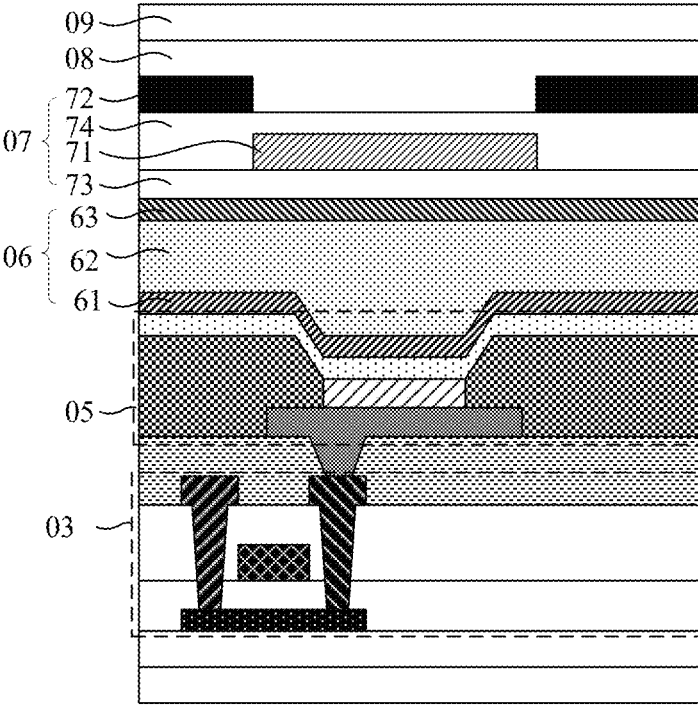
FIG. 3 is a schematic diagram of another organic light-emitting display panel according to an embodiment of this application.
Figure 4:
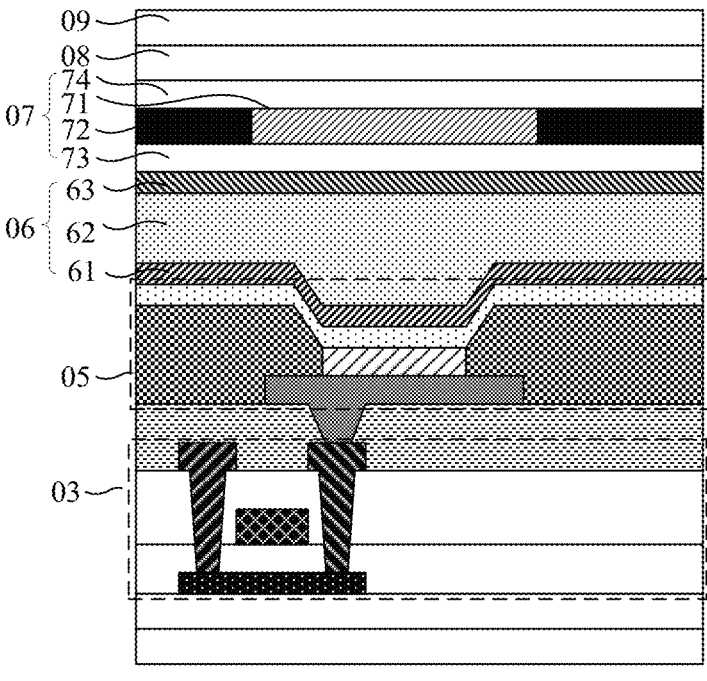
FIG. 4 is a schematic diagram of still another organic light-emitting display panel according to an embodiment of this application.

FIG. 3 is a schematic diagram of another organic light-emitting display panel according to an embodiment of this application. FIG. 4 is a schematic diagram of still another organic light-emitting display panel according to an embodiment of this application.

A difference between the organic light-emitting display panel shown in FIG. 3 and the organic light-emitting display panel shown in FIG. 1 and FIG. 2 is that the color-blocking blocks 71 in the organic light-emitting display panel shown in FIG. 1 and FIG. 2 are filled between adjacent black light-shielding blocks 72, and the organic light-emitting display panel shown in FIG. 3 further includes a first planarization layer 73 and a second planarization layer 74. As shown in FIG. 3, in the thickness direction of the organic light-emitting display panel, the first planarization layer 73 is disposed on a side that is of the optical filter layer 07 and that is close to the encapsulation layer 06, and the second planarization layer 74 is disposed between the color-blocking blocks 71 and the black light-shielding blocks 72. That the black light-shielding blocks 72 and the color-blocking blocks 71 are alternately arranged specifically indicates that projections of the plurality of black light-shielding blocks 72 in the thickness direction of the organic light-emitting display panel and projections of the plurality of color-blocking blocks 71 in the thickness direction of the organic light-emitting display panel are alternately arranged. In this embodiment of this application, the optical filter layer 07 is disposed between the encapsulation layer 06 and the coating planarization layer 08. Matching may be performed among refractive indexes of the optical filter layer 07, the encapsulation layer 06, and the coating planarization layer 08, so that the reflectivity of the organic light-emitting display panel to the external ambient light can be reduced and luminous efficacy for displayed light of the organic light-emitting display panel can be improved.

Specifically, in the encapsulation layer 06, the second inorganic insulation layer 63 is close to the optical filter layer 07. In this case, in a direction from the emissive layer 05 in the organic light-emitting display panel to the out-light surface of the organic light-emitting display panel, the second inorganic insulation layer 63, the first planarization layer 73, the second planarization layer 74, and the coating planarization layer 08 are sequentially disposed, and refractive indexes of these layers sequentially decrease. Specifically, the refractive index of the second inorganic insulation layer 63 may be approximately 1.8, the refractive index of the first planarization layer 73 may be approximately 1.62, the refractive index of the second planarization layer 74 may be approximately 1.55, and the refractive index of the coating planarization layer 08 may be approximately 1.52. In addition, a refractive index of the second substrate 09 may be approximately 1.52.

It should be noted that, in this embodiment of this application, the refractive indexes of the second inorganic insulation layer 63, the first planarization layer 73, the second planarization layer 74, the coating planarization layer 08, and the second substrate 09 may be close to the foregoing values of the refractive indexes. There may be specifically a relatively small deviation. For example, the refractive index of the first planarization layer 73 may be 1.62±0.05, and the refractive index of the second planarization layer 74 may be 1.55±0.05.

In addition, a main function of the color-blocking block 71 in the optical filter layer 07 is to filter light passing through the color-blocking block 71. Therefore, a material included in the color-blocking block 71 is relatively fixed. A refractive index of the green color-blocking block 71a is approximately 1.61, a refractive index of the blue color-blocking block 71b is approximately 1.54, and a refractive index of the red color-blocking block 71c is approximately 1.67. In addition, a refractive index of the black light-shielding block 72 may be set to 1.52±0.03.

The inventor learns through experiments that, in the organic light-emitting display panel provided in this embodiment of this application, if matching is not performed among the refractive indexes of the optical filter layer 07, the encapsulation layer 06, and the coating planarization layer 08, a change in the refractive index at a location of the optical filter layer 07 may have a contribution of approximately 0.5% to the reflectivity of the organic light-emitting display panel to the external ambient light. After matching is performed among the refractive indexes of the optical filter layer 07, the encapsulation layer 06, and the coating planarization layer 08 based on the foregoing values of the refractive indexes, a contribution of the optical filter layer 07 to the reflectivity of the organic light-emitting display panel to the external ambient light is approximately reduced to 0.2%. In this way, the reflection of the external ambient light on the organic light-emitting display panel is further reduced.

In another implementation of this embodiment, as shown in FIG. 4, the second planarization layer 74 may be alternatively disposed on a side that is of the optical filter layer 07 and that is close to the coating planarization layer 08. In other words, the color-blocking blocks 71 and the black light-shielding blocks 72 are disposed between the first planarization layer 73 and the second planarization layer 74.

Still with reference to FIG. 3 and FIG. 4, in an embodiment of this application, the second planarization layer 74 may have a haze from 1% to 3%. Particle doping may be performed on the second planarization layer 74, so that the second planarization layer 74 has a specific haze. Specifically, a thickness of the second planarization layer 74 ranges from 2 μm to 3 μm. Doped particles may be specifically small inorganic particles, polymer beads, small polymer particles obtained through photopolymerization, or the like. A size of the doped particle ranges from 500 nm to 800 nm. The haze of the second planarization layer 74 is set to 1% to 3%, so that a diffraction phenomenon caused due to the reflection of the external ambient light on the organic light-emitting display panel can be eliminated. In this way, the following case is avoided: A bright spot appears when the organic light-emitting display panel performs display, thereby affecting viewing experience and definition.

Figure 5:
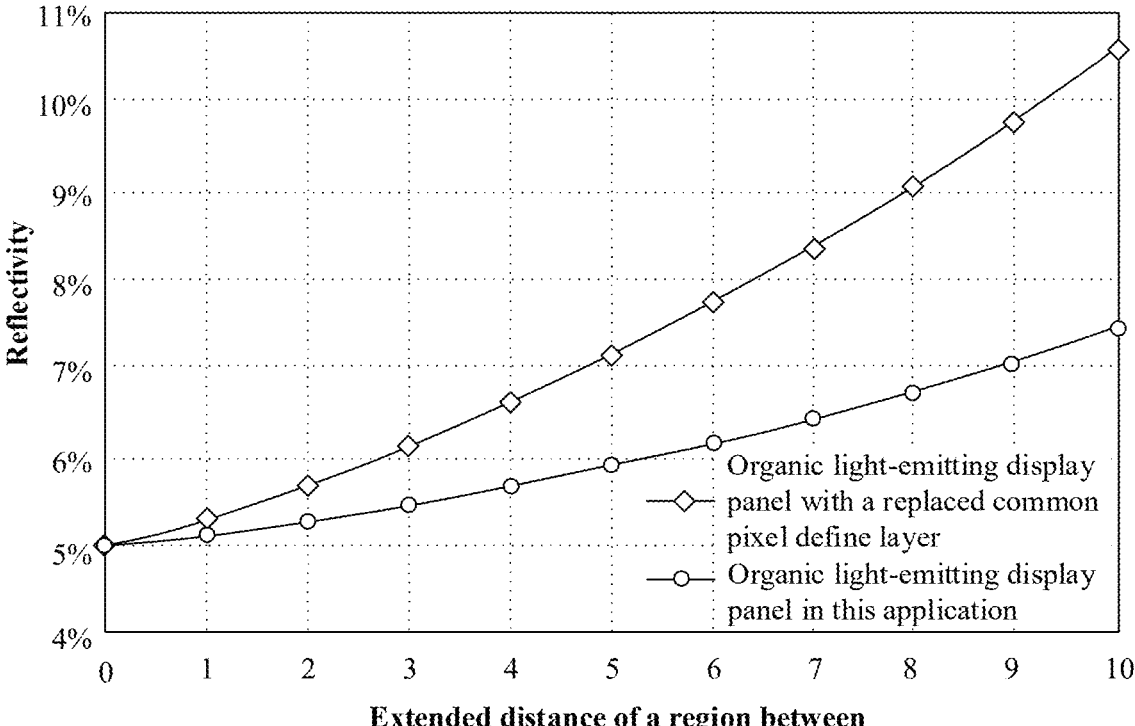
FIG. 5 is a schematic diagram of a relationship between a reflectivity of an organic light-emitting display panel and an extended distance of a region between adjacent black light-shielding blocks.

FIG. 5 is a schematic diagram of a relationship between a reflectivity of an organic light-emitting display panel and an extended distance of a region between adjacent black light-shielding blocks. In FIG. 5, the extended distance, indicated by a horizontal coordinate, of the region between adjacent black light-shielding blocks is an extended distance of the region between adjacent black light-shielding blocks 72 relative to the corresponding organic light-emitting unit 51a/51b/51c, that is, an extended distance of the part that is of the color-blocking block 71 and that is located between adjacent black light-shielding blocks 72 relative to the corresponding organic light-emitting unit; and the reflectivity indicated by a vertical coordinate is the reflectivity of the organic light-emitting display panel to the external ambient light. It can be learned from FIG. 5 that, when the black light-absorbing pixel define layer 54 in the organic light-emitting display panel provided in this embodiment of this application is replaced with a conventional pixel define layer, in comparison with an organic light-emitting display panel including the pixel define layer 54 with a light density of 30%, the organic light-emitting display panel including the conventional pixel define layer has an apparent problem of an increased reflectivity of the organic light-emitting display panel due to an increase of the extended distance of the region between adjacent black light-shielding blocks. In other words, when the optical filter layer 07 is disposed on the first substrate 01 and an area of the part that is of the color-blocking block 71 and that is located between adjacent black light-shielding blocks 72 is greater than the area of the corresponding organic light-emitting unit 51a/51b/51c, the organic light-emitting display panel includes the black light-absorbing pixel define layer 54, so that the reflection of the organic light-emitting display panel to the external ambient light can be apparently reduced.

In addition, it can also be learned from FIG. 5 that, when the reflectivities to the external ambient light are consistent, in comparison with the organic light-emitting display panel including the conventional pixel define layer, the extended distance of the region between adjacent black light-shielding blocks 72 may be set to relatively large in the organic light-emitting display panel including the pixel define layer 54 in this application. Therefore, when the reflectivity of the organic light-emitting display panel to the external ambient light falls within a specific range, room for adjusting the region between adjacent black light-shielding blocks 72 in the organic light-emitting display panel provided in this embodiment of this application is enlarged, so that larger room for operations is provided for adjusting matching shapes of different colors of subpixels based on a shape of the region between adjacent black light-shielding blocks 72 and shapes of the color-blocking blocks 71 located between adjacent black light-shielding blocks 72, thereby further improving a color cast problem.

Figures 6, 7:
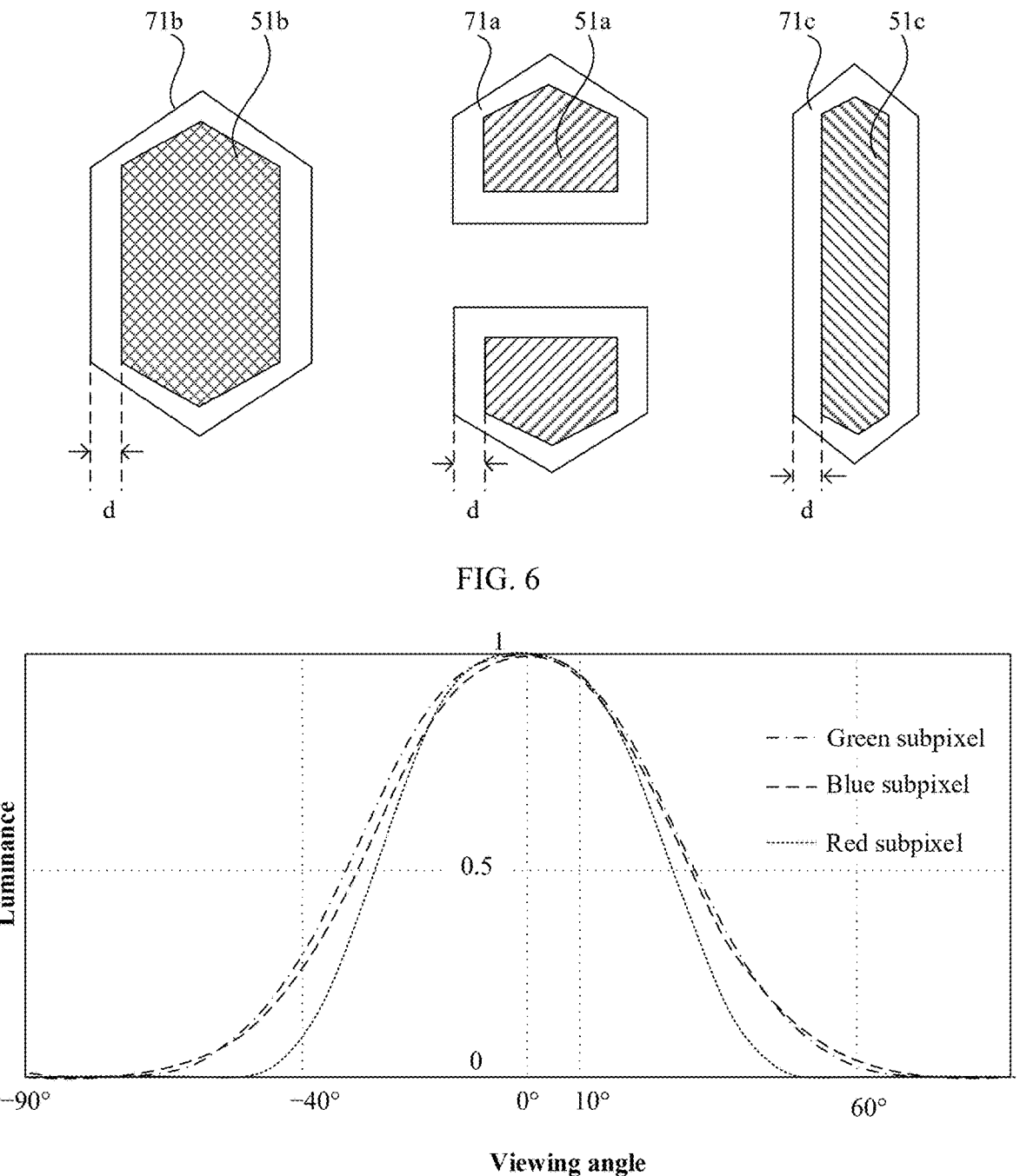
FIG. 6 is a schematic plane view of organic light-emitting units and optical filter units according to an embodiment of this application.
FIG. 7 is a schematic diagram of a relationship between a viewing angle and luminance of an organic light-emitting display panel in a subpixel arrangement manner shown in FIG. 6.

FIG. 6 is a schematic plane view of organic light-emitting units and color-blocking blocks between adjacent black light-shielding blocks according to an embodiment of this application. In a plane perpendicular to the thickness direction of the organic light-emitting display panel, a minimum distance between an edge of the organic light-emitting unit 51a/51b/51c and an edge of the corresponding region between adjacent black light-shielding blocks 72 is a first distance d. As shown in FIG. 6, a distance between the edge of the corresponding organic light-emitting unit 51a/51b/51c and an edge of the part that is of the color-blocking block 71a/71b/71c and that is located between adjacent black light-shielding blocks 72 is the first distance d, and d is greater than 0.5 μm. The part that is of the color-blocking block 71a/71b/71c and that is located between adjacent black light-shielding blocks 72 is extended by more than 0.5 μm relative to the corresponding organic light-emitting unit 51a/51b/51c, so that transmittance of the organic light-emitting display panel can be increased. In addition, the black light-absorbing pixel define layer 54 in this application is used, thereby avoiding a problem of an increased reflectivity of the anode to external light due to extension of the region between adjacent black light-shielding blocks 72.

Figures 8, 9:
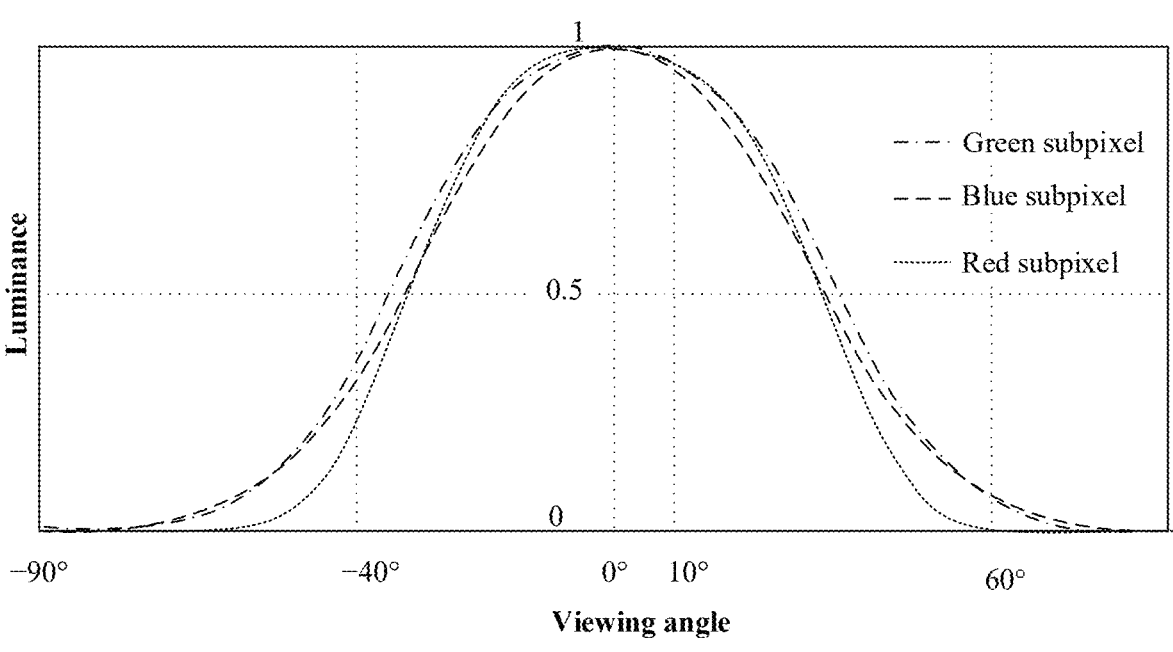
FIG. 8 is a schematic diagram of another relationship between a viewing angle and luminance of an organic light-emitting display panel in a subpixel arrangement manner shown in FIG. 6.
FIG. 9 is another schematic plane view of organic light-emitting units and color-blocking blocks between adjacent black light-shielding blocks according to an embodiment of this application.

FIG. 7 is a schematic diagram of a relationship between a viewing angle and luminance of an organic light-emitting display panel in a subpixel arrangement manner shown in FIG. 6. FIG. 8 is a schematic diagram of another relationship between a viewing angle and luminance of an organic light-emitting display panel in a subpixel arrangement manner shown in FIG. 6. In FIG. 7 and FIG. 8, the viewing angle indicated by a horizontal coordinate indicates different viewing angles at which a human eye watches the organic light-emitting display panel, and the luminance indicated by a vertical coordinate is luminance of light emission of the organic light-emitting display panel.

The tested organic light-emitting display panel in FIG. 7 is an organic light-emitting display panel that includes a conventional pixel define layer and in which the region, corresponding to each subpixel, between adjacent black light-shielding blocks 72 is extended by 3 μm. In other words, the first distance d corresponding to the region between adjacent black light-shielding blocks 72 is equal to 3 μm. The tested organic light-emitting display panel in FIG. 8 is an organic light-emitting display panel that includes the black light-absorbing pixel define layer 54 in this application and in which the region, corresponding to each subpixel, between adjacent black light-shielding blocks 72 is extended by 3 μm. In other words, the first distance d corresponding to the region between adjacent black light-shielding blocks 72 is equal to 3 μm. When the conventional pixel define layer is used, it can be learned from FIG. 7 that luminance of a red subpixel decreases obviously as the viewing angle increases. Consequently, a color cast problem occurs at a large viewing angle. However, after the black light-absorbing pixel define layer 54 is used, in comparison with FIG. 7, in FIG. 8, a decrease amplitude of luminance of a red subpixel tends to be close to that of another color of subpixel as the viewing angle increases. Therefore, a color cast problem can be improved.

Figure 10:
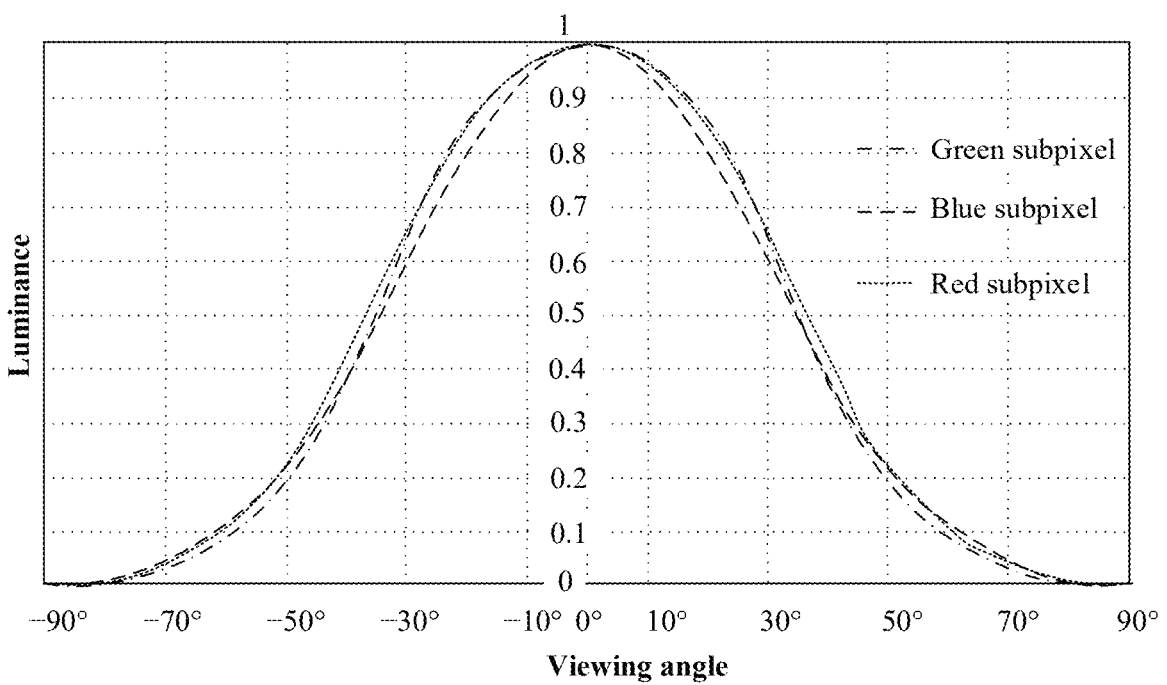
FIG. 10 is a schematic diagram of a relationship between a viewing angle and luminance of an organic light-emitting display panel in a subpixel arrangement manner shown in FIG. 9.

FIG. 9 is another schematic plane view of organic light-emitting units and color-blocking blocks between adjacent black light-shielding blocks according to an embodiment of this application. FIG. 10 is a schematic diagram of a relationship between a viewing angle and luminance of an organic light-emitting display panel in a subpixel arrangement manner shown in FIG. 9. A difference between the embodiment shown in FIG. 9 and the embodiment shown in FIG. 6 is that the part that is of the color-blocking block 71 and that is located between adjacent black light-shielding blocks 72 is designed with rounded corners. In other words, the region between adjacent black light-shielding blocks 72 is designed with rounded corners.

It can be learned from FIG. 10 that various colors of subpixels have basically same luminance at a large viewing angle when the color-blocking block 71 is designed with rounded corners in the organic light-emitting display panel, that is, the region between adjacent black light-shielding blocks 72 is designed with rounded corners, the tested organic light-emitting display panel still includes the black light-absorbing pixel define layer 54 in this application, and the region, corresponding to each subpixel, between adjacent black light-shielding blocks 72 is extended by 3 μm. Therefore, the color cast problem of the display panel can be greatly improved.

Figure 11:
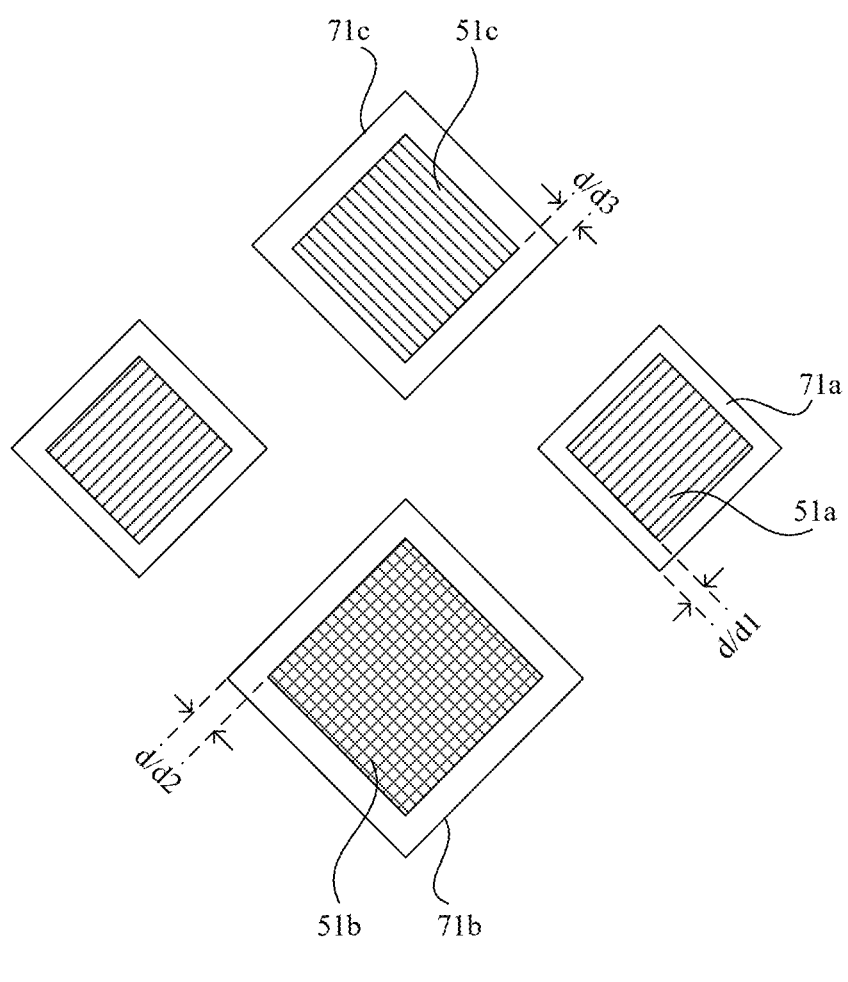
FIG. 11 is still another schematic plane view of organic light-emitting units and color-blocking blocks between adjacent black light-shielding blocks according to an embodiment of this application.
Figure 12:
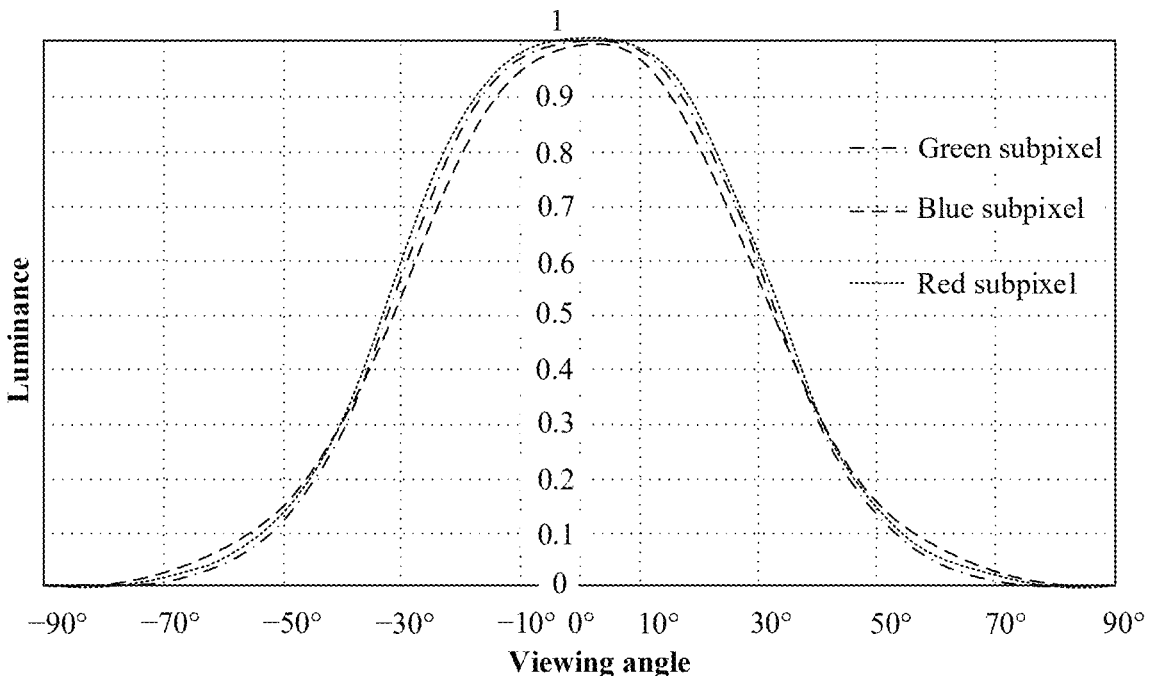
FIG. 12 is a schematic diagram of a relationship between a viewing angle and luminance of an organic light-emitting display panel in a subpixel arrangement manner shown in FIG. 11.
Figure 13:
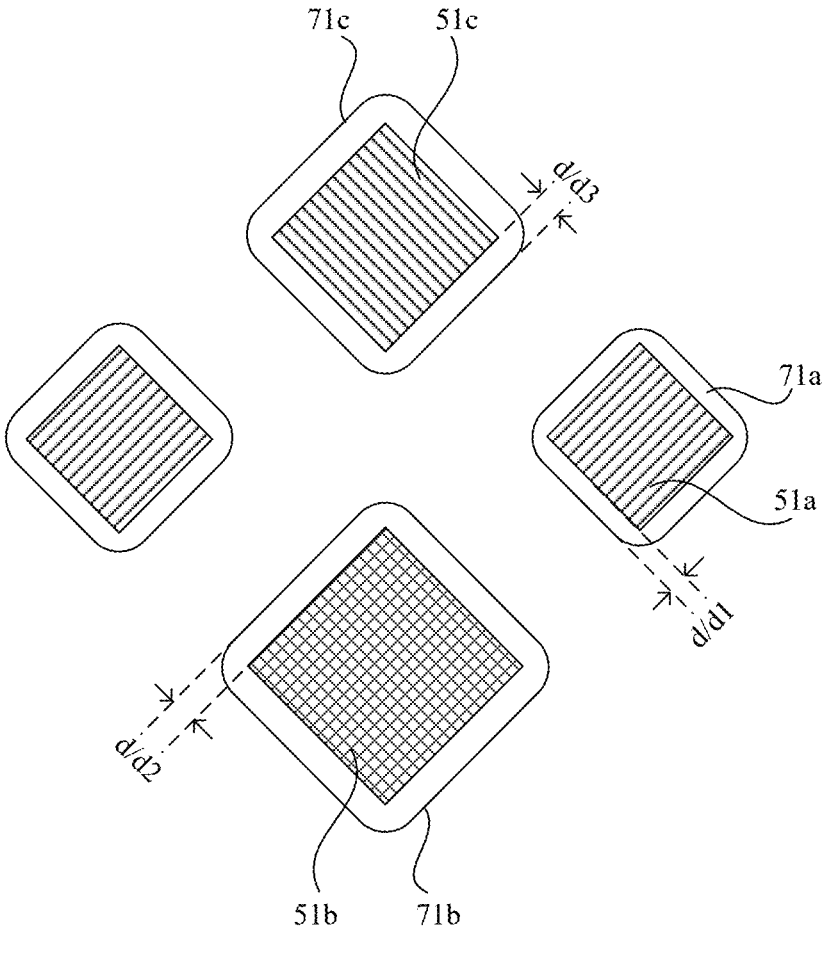
FIG. 13 is yet another schematic plane view of organic light-emitting units and color-blocking blocks between adjacent black light-shielding blocks according to an embodiment of this application.
Figure 14:
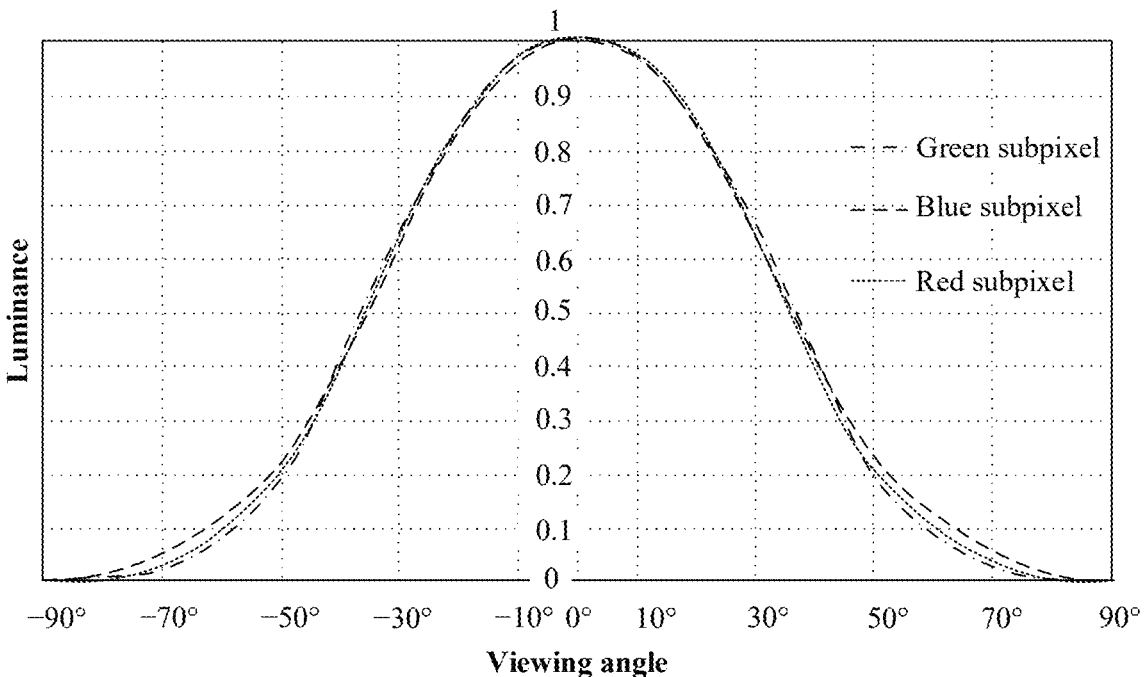
FIG. 14 is a schematic diagram of a relationship between a viewing angle and luminance of an organic light-emitting display panel in a subpixel arrangement manner shown in FIG. 13.

FIG. 11 is still another schematic plane view of organic light-emitting units and color-blocking blocks between adjacent black light-shielding blocks according to an embodiment of this application. FIG. 12 is a schematic diagram of a relationship between a viewing angle and luminance of an organic light-emitting display panel in a subpixel arrangement manner shown in FIG. 11. FIG. 13 is yet another schematic plane view of organic light-emitting units and color-blocking blocks between adjacent black light-shielding blocks according to an embodiment of this application. FIG. 14 is a schematic diagram of a relationship between a viewing angle and luminance of an organic light-emitting display panel in a subpixel arrangement manner shown in FIG. 13.

With reference to FIG. 11 and FIG. 13, the first distance d between a part that is of the green color-blocking block 71a and that is located between adjacent black light-shielding blocks 72, and the corresponding green organic light-emitting unit 51a is specifically d1; the first distance d between a part that is of the blue color-blocking block 71b and that is located between adjacent black light-shielding blocks 72, and the corresponding blue organic light-emitting unit 51b is specifically d2; and the first distance d between a part that is of the red color-blocking block 71c and that is located between adjacent black light-shielding blocks 72, and the corresponding red organic light-emitting unit 51c is specifically d3. Herein, d1, d2, and d3 may be designed to be different. Specifically, d1<d2<d3.

The tested organic light-emitting display panel in FIG. 11 includes the black light-absorbing pixel define layer 54 in this application, and the part that is of the color-blocking block 71 corresponding to each subpixel and that is located between adjacent black light-shielding blocks 72 is extended by 3 μm relative to the corresponding organic light-emitting unit. In other words, d1=d2=d3=3 μm. A difference between the tested organic light-emitting display panel in FIG. 13 and that in FIG. 11 is that, the part that is of the color-blocking block 71 and that is located between adjacent black light-shielding blocks 72 is designed with rounded corners, the part that is of the color-blocking block 71 and that is located between adjacent black light-shielding blocks 72 is extended by an increased distance relative to the corresponding organic light-emitting unit, and the parts that are of the color-blocking blocks 71 corresponding to different colors of subpixels and that are located between adjacent black light-shielding blocks 72 are extended by different distances relative to the corresponding organic light-emitting units. In other words, d1=3 μm, d2=1.5 μm, d3=5 μm.

It can be learned through comparison between FIG. 14 and FIG. 12 that a greater extended distance of the color-blocking block 71 between adjacent black light-shielding blocks 72 relative to the corresponding organic light-emitting unit indicates higher luminance of the organic light-emitting display panel at the same viewing angle. In addition, d1, d2, and d3 are properly matched, so that d1<d2<d3, thereby improving luminance consistency of different colors of subpixels at a same viewing angle to avoid a color cast problem. Further, because the black light-absorbing pixel define layer 54 is disposed, even if d1=3 μm and d3-5 μm, that is, the color-blocking blocks 71 between adjacent black light-shielding blocks 72 are extended by relatively large distances relative to the corresponding organic light-emitting units, the reflectivity of the display panel to the external ambient light is not increased.

It should be noted that, in this embodiment of this application, d1, d2, and d3 may be close to the foregoing values of the refractive indexes. There may be specifically a relatively small deviation. For example, d1 ranges from 2 μm to 4 μm, d2 ranges from 0.5 μm to 2.5 μm, and d3 ranges from 3.5 μm to 6.5 μm.

With reference to FIG. 5 and FIG. 14, it can be learned that the shape of the color-blocking block 71 between adjacent black light-shielding blocks 72 is optimized, that is, the shape of the region between adjacent black light-shielding blocks 72 is optimized, so that the first distance d can satisfy that d≥5 μm when it is ensured that the reflectivity of the organic light-emitting display panel to the external ambient light is less than 6% and a color cast is relatively small at a large viewing angle. In this way, the luminance of the organic light-emitting display panel is apparently increased.

It should be noted that, in this embodiment of this application, a shape of the subpixel may be a rhombus shown in FIG. 11 and FIG. 13, or may be any one of a hexagon, a circle, a rectangle, and an octagon. In other words, the shape of the region between adjacent black light-shielding blocks 72 and the shape of the color-blocking block 71 disposed in the region may be any one of a rhombus, a hexagon, a circle, a rectangle, and an octagon.

In an embodiment of this application, the display panel provided in this application may perform light emission for display, and may further collect a biometric feature image, for example, collect fingerprint information, iris information, and facial information. When the display panel collects the biometric feature image by using an optical sensor, the detect light can be transmitted to the display panel, so that the optical sensor emits and receives the detect light.

In an embodiment of this application, to ensure transmittance for the detect light, the black light-shielding blocks 72 and the black light-absorbing pixel define layer 54 may be detect light-transparent film layers. In other words, the black light-shielding blocks 72 and the pixel define layer 54 have relatively high absorbance for visible light, and have relatively high transmittance for the detect light. In this embodiment of this application, the detect light may be infrared light. In this case, both the black light-shielding blocks 72 and the black light-absorbing pixel define layer 54 are infrared-transparent film layers.

Figure 15:
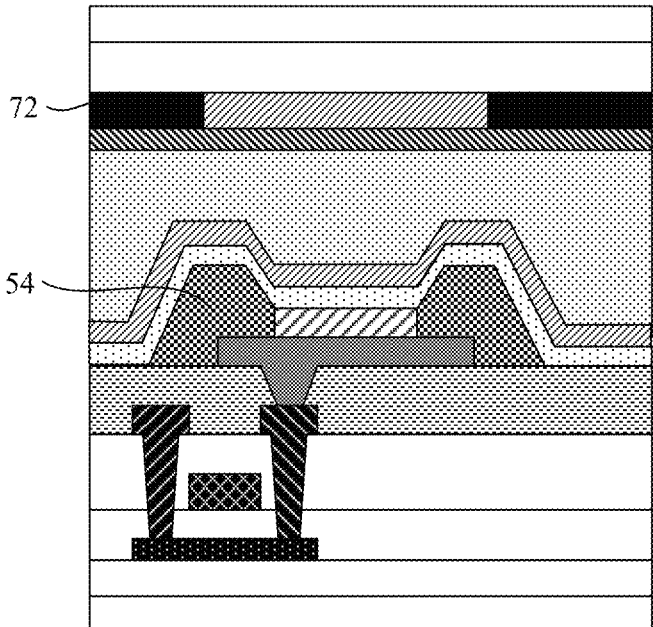
FIG. 15 is a schematic diagram of yet another organic light-emitting display panel according to an embodiment of this application.

FIG. 15 is a schematic diagram of yet another organic light-emitting display panel according to an embodiment of this application. As shown in FIG. 15, in the thickness direction of the organic light-emitting display panel, the pixel define layer 54 under the black light-shielding blocks 72 is a discontinuous structure. In other words, at least some locations under the black light-shielding blocks 72 may not be provided with a substantive structure of the pixel define layer 54. In this case, at a location at which the black light-shielding block 72 is disposed and the pixel define layer 54 is not disposed, the black light-shielding blocks 72 may be used to reduce transmission of the visible ambient light to the internal film layer of the organic light-emitting display panel. For a location at which the black pixel define layer 54 is not disposed, the transmittance for the detect light can be increased, so that the transmittance of the organic light-emitting display panel for the detect light is further improved. In other words, the transmittance for the detect light is increased when a relatively low reflectivity to the external ambient light is ensured.

In an embodiment of this application, the planarization layer 04 may also be a black light-absorbing layer. In this case, the planarization layer 04 can prevent ambient light from being transmitted to the drive circuit layer 03, thereby reducing a risk that a metal signal cable and the like at the drive circuit layer 03 reflect to the external ambient light.

In addition, when the display panel collects a biometric feature image by using the optical sensor, the planarization layer 04 also needs to allow the detect light to pass through. In this embodiment of this application, when the detect light is infrared light, the planarization layer 04 is an infrared-transparent black light-absorbing layer.

Figure 16:
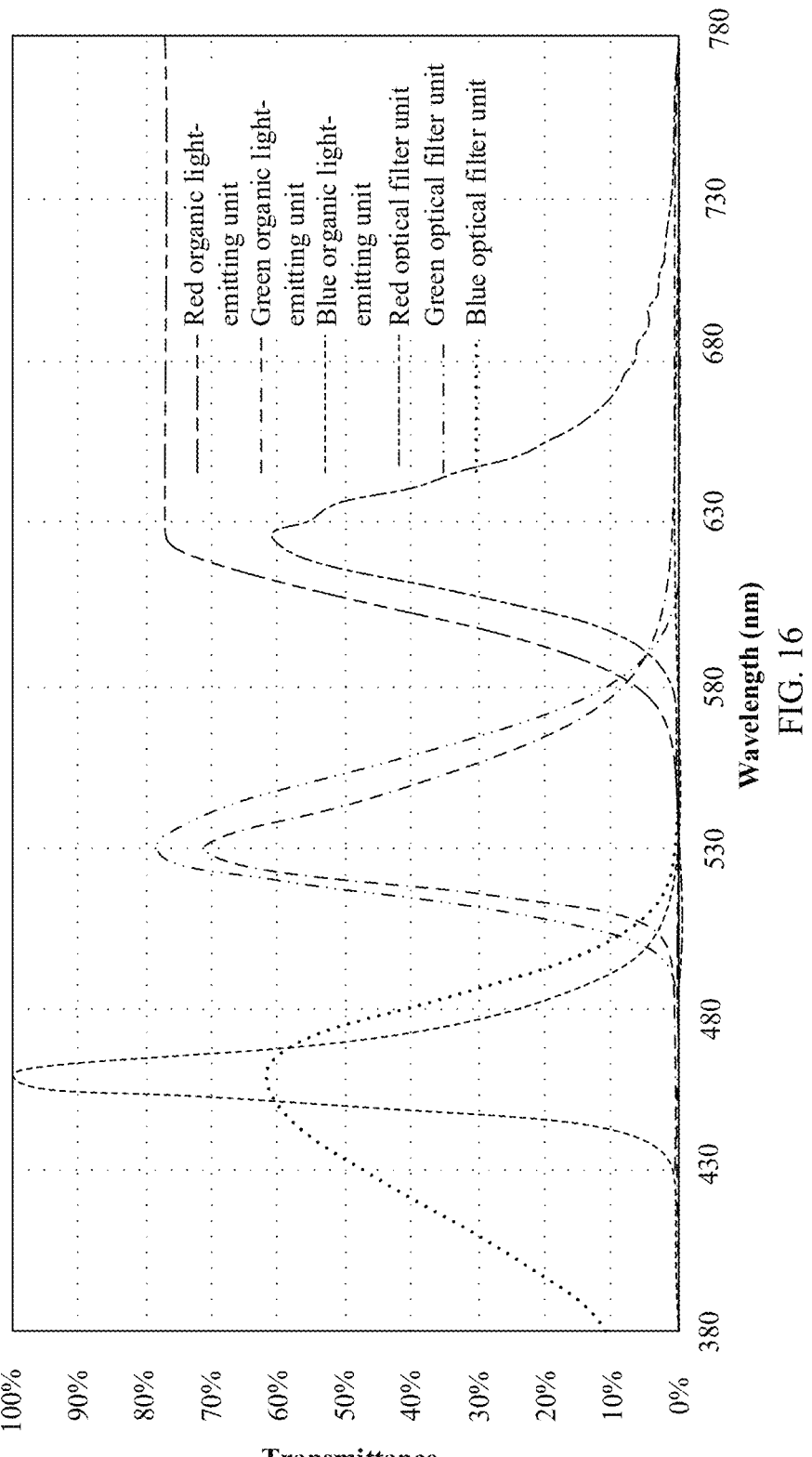
FIG. 16 is a spectrogram of color-blocking blocks and organic light-emitting units according to an embodiment of this application.

FIG. 16 is a spectrogram of color-blocking blocks and organic light-emitting units according to an embodiment of this application. A vertical coordinate indicates transmittance of the color-blocking blocks 71, and a horizontal coordinate indicates wavelengths corresponding to different colors of light.

In an implementation of this embodiment of this application, dye components, proportions, concentrations, and the like in different colors of color-blocking blocks 71 may be adjusted. In this way, peak values of optical spectrums of the color-blocking blocks 71 match peak values of optical spectrums of the corresponding organic light-emitting units, thereby improving and matching luminous efficacy for various colors of light.

As shown in FIG. 16, a full width at half maximum of an optical spectrum of the green color-blocking block 71*a* is set to less than or equal to 70 nm, and a full width at half maximum corresponding to a short wavelength of an optical spectrum of the red color-blocking block 71*c* is set to less than or equal to 25 nm, that is, the full width at half maximum corresponding to a left half part of the optical spectrum of the red color-blocking block 71*c* in FIG. 16 is set to less than or equal to 25 nm. In addition, a peak value of the optical spectrum of the green color-blocking block 71*a* matches a peak value of the optical spectrum of the green organic light-emitting unit 51*a*, and a peak value of the optical spectrum of the red color-blocking block 71*c* matches a peak value of an optical spectrum of the red organic light-emitting unit 51*c*. In this case, wavelength ranges of green light and red light respectively allowed to pass through the green color-blocking block 71*a* and the red color-blocking block 71*c* are narrowed, so that intensity of the external ambient light reaching the anode in the light-emitting device through the green color-blocking block 71*a* and the red color-blocking block 71*c* is reduced. In addition, the external ambient light reflected by the anode in the light-emitting device to the out-light surface of the organic light-emitting display panel is relatively reduced, thereby effectively reducing reflection of the external ambient light on the organic light-emitting display panel.

In addition, as shown in FIG. 16, the full width at half maximum of the optical spectrum of the blue color-blocking block 71*b* is set to greater than or equal to 60 nm and less than or equal to 100 nm, and a peak value of the optical spectrum of the blue color-blocking block 71*b* matches a peak value of the optical spectrum of the blue organic light-emitting unit 51*b*. The full width at half maximum of the blue color-blocking block 71*b* is widened, so that transmittance of the blue color-blocking block 71*b* can be improved. In this way, the luminance of the blue subpixel can be properly improved, and the service life of the blue subpixel can be further prolonged.

In addition, the full width at half maximum of the optical spectrum of the green color-blocking block 71*a* is narrowed to be less than or equal to 70 nm, the full width at half maximum of the left half part of the optical spectrum of the red color-blocking block 71*c* is narrowed to be less than or equal to 25 nm, and the full width at half maximum of the optical spectrum of the blue color-blocking block 71*b* is widened to be greater than or equal to 60 nm and less than or equal to 100 nm. The peak values of the optical spectrums of the different colors of color-blocking blocks 71 match the peak values of the optical spectrums of the corresponding organic light-emitting units. In this case, the thickness of the color-blocking block 71 is set to only 1 µm to 3 µm. In this way, a transmittance of the green subpixel approximately ranges from 60% to 80%, a transmittance of the blue subpixel approximately ranges from 50% to 70%, and a transmittance of the red subpixel approximately ranges from 70% to 95%, thereby implementing white balance for white light of the organic light-emitting display panel. In other words, in this application, normal white balance of the organic light-emitting display panel is implemented by using the optical spectrums of different colors of color-blocking blocks 71 and the optical spectrums of the corresponding organic light-emitting units, while luminance of the organic light-emitting units does not need to be adjusted.

In another embodiment of this application, an upper surface of the black light-shielding block 72 may be further disposed as an uneven rough structure, and a roughness of the rough structure ranges from 15 nm to 20 nm. In this design, an interfacial reflectivity between the surface coating planarization layer 08 and the black light-shielding blocks 72 can be reduced to less than 0.1%, that is, R2≤0.1%. The rough structure of the surface of the black light-shielding block 72 may be prepared through bombarding the surface of the black light-shielding block 72 by using plasma. Specifically, a plasma bombardment environment is a 0.3 Torr vacuum environment including argon, where a radio frequency of the plasma is 400, and a flow rate is 500.

Figure 17:
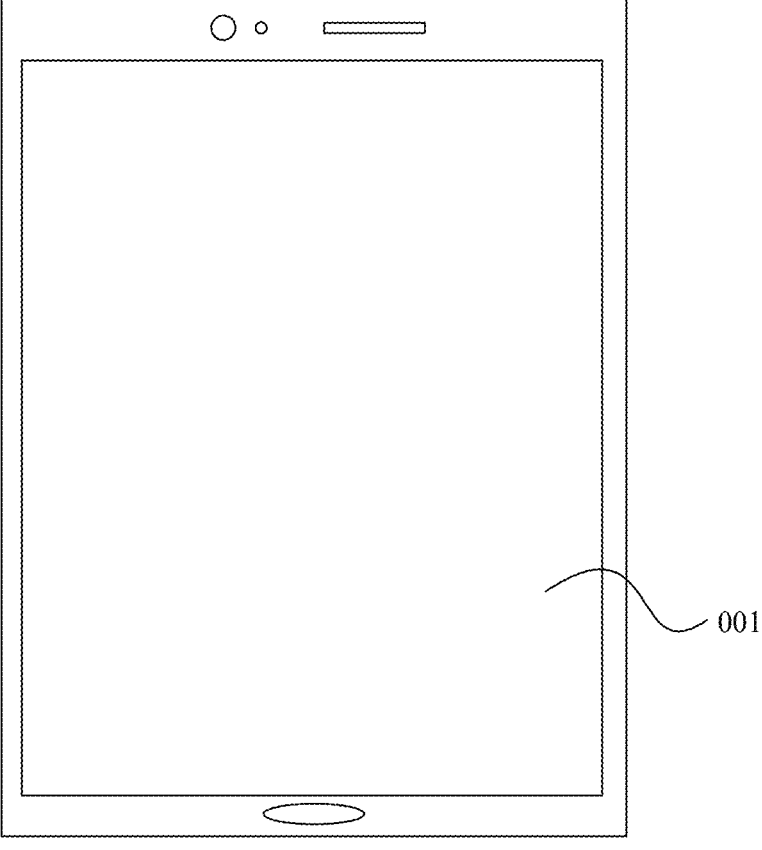
FIG. 17 is a schematic diagram of a display apparatus according to an embodiment of this application.

This application further provides a display apparatus. FIG. 17 is a schematic diagram of a display apparatus according to an embodiment of this application. In an embodiment of this application, as shown in FIG. 17, the display apparatus includes the organic light-emitting display panel 001 provided in any embodiment of this application. A specific structure of the organic light-emitting display panel 001 has been described in detail in the foregoing embodiments. Details are not described herein again. Certainly, the electronic device shown in FIG. 17 is merely an example for description, and may be, for example, any electronic device with a display function, such as a mobile phone, a tablet computer, a notebook computer, an e-book, a television, or a smartwatch.

The foregoing descriptions are merely specific implementations of this application. Any variation or replacement readily figured out by a person skilled in the art within the technical scope disclosed in this application shall fall within the protection scope of this application. The protection scope of this application shall be subject to the protection scope of the claims.

What is claimed is:

1. An organic light-emitting display panel, comprising a first substrate, wherein a functional layer is disposed on the first substrate, and the functional layer comprises:

an emissive layer, wherein the emissive layer comprises a plurality of organic light-emitting units and a pixel define layer, and the pixel define layer is disposed between adjacent organic light-emitting units; and an optical filter layer, wherein the optical filter layer is disposed on a side that is of the emissive layer and that is close to an out-light surface of the organic light-emitting display panel, the optical filter layer comprises a plurality of color-blocking blocks and a plurality of black light-shielding blocks, the black light-shielding blocks and the color-blocking blocks are alternately arranged, and the color-blocking blocks and the organic light-emitting units are disposed in a one-to-one correspondence manner, wherein a region between adjacent black light-shielding blocks covers the organic light-emitting unit in a thickness direction of the organic light-emitting display panel, and the pixel define layer is a black light-absorbing layer; and wherein the organic light-emitting display panel is further configured to perform light emission for display and collect a biometric feature image including iris information and facial information using an optical sensor for emitting or receiving infrared light.

2. The organic light-emitting display panel according to claim 1, wherein the pixel define layer and the black light-shielding blocks are infrared-transparent black light-absorbing layers.

3. The organic light-emitting display panel according to claim 1, further comprising:

a drive circuit layer, wherein the drive circuit layer comprises a plurality of transistor structures; and a planarization layer, wherein the planarization layer is disposed between the drive circuit layer and the emissive layer, and the planarization layer is a black light-absorbing layer.

4. The organic light-emitting display panel according to claim 3, wherein the planarization layer is an infrared-transparent black light-absorbing layer.

5. The organic light-emitting display panel according to claim 1, wherein the pixel define layer under the black light-shielding blocks is a discontinuous structure in the thickness direction of the organic light-emitting display panel.

6. The organic light-emitting display panel according to claim 1, wherein in a plane perpendicular to the thickness direction of the organic light-emitting display panel, a minimum distance between an edge of the organic light-emitting unit and an edge of the corresponding region between adjacent black light-shielding blocks is a first distance, and the first distance is greater than 0.5 µm.

7. The organic light-emitting display panel according to claim 6, wherein the plurality of organic light-emitting units comprise a green organic light-emitting unit, a blue organic light-emitting unit, and a red organic light-emitting unit; and the first distance corresponding to the green organic light-emitting unit is 3 µm, the first distance corresponding to the blue organic light-emitting unit is 1.5 µm, and the first distance corresponding to the red organic light-emitting unit is 5 µm.

8. The organic light-emitting display panel according to claim 1, wherein the plurality of organic light-emitting units comprise a green organic light-emitting unit, a blue organic light-emitting unit, and a red organic light-emitting unit: the plurality of color-blocking blocks comprise a green color-blocking block, a blue color-blocking block, and a red color-blocking block; and the green organic light-emitting unit is disposed in a correspondence with the green color-blocking block, the blue organic light-emitting unit is disposed in a correspondence with the blue color-blocking block, and the red organic light-emitting unit is disposed in a correspondence with the red color-blocking block; and a full width at half maximum of an optical spectrum of the green color-blocking block is less than or equal to 70 nm, a full width at half maximum of an optical spectrum of the blue color-blocking block is greater than or equal to 60 nm and less than or equal to 100 nm, and a full width at half maximum corresponding to a short wavelength of an optical spectrum of the red color-blocking block is less than or equal to 25 nm.

9. The organic light-emitting display panel according to claim 1, further comprising an encapsulation layer, a first planarization layer, a second planarization layer, and a coating planarization layer:

wherein the encapsulation layer is disposed between the emissive layer and the first planarization layer, and comprises a first inorganic insulation layer, an organic insulation layer, and a second inorganic insulation layer: the organic insulation layer is disposed between the first inorganic insulation layer and the second inorganic insulation layer; and the second inorganic insulation layer is disposed on a side that is of the organic insulation layer and that is close to the first planarization layer;

at least one of the color-blocking block and the black light-shielding block is located between the first planarization layer and the second planarization layer, and the second planarization layer is disposed on a side that is of the first planarization layer and that is close to the coating planarization layer; and a refractive index of the second inorganic insulation layer, a refractive index of the first planarization layer, a refractive index of the second planarization layer, and a refractive index of the coating planarization layer sequentially decrease.

10. The organic light-emitting display panel according to claim 9, wherein the refractive index of the second inorganic insulation layer is 1.8, the refractive index of the first planarization layer is 1.62, the refractive index of the second planarization layer is 1.55, and the refractive index of the coating planarization layer is 1.52.

11. A display apparatus, comprising an organic light-emitting display panel, wherein the organic light-emitting display panel comprises a first substrate, wherein a functional layer is disposed on the first substrate, and the functional layer comprises:

an emissive layer, wherein the emissive layer comprises a plurality of organic light-emitting units and a pixel define layer, and the pixel define layer is disposed between adjacent organic light-emitting units; and an optical filter layer, wherein the optical filter layer is disposed on a side that is of the emissive layer and that is close to an out-light surface of the organic light-emitting display panel, the optical filter layer comprises a plurality of color-blocking blocks and a plurality of black light-shielding blocks, the black light-shielding blocks and the color-blocking blocks are alternately arranged, and the color-blocking blocks and the organic light-emitting units are disposed in a one-to-one correspondence manner, wherein a region between adjacent black light-shielding blocks covers the organic light-emitting unit in a thickness direction of the organic light-emitting display panel, and the pixel define layer is a black light-absorbing layer; and wherein the organic light-emitting display panel is further configured to perform light emission for display and collect a biometric feature image including iris information and facial information using an optical sensor for emitting or receiving infrared light.

12. The display apparatus according to claim 11, wherein the pixel define layer and the black light-shielding blocks are infrared-transparent black light-absorbing layers.

13. The display apparatus according to claim 11, wherein the organic light-emitting display panel further comprises:

a drive circuit layer, wherein the drive circuit layer comprises a plurality of transistor structures; and a planarization layer, wherein the planarization layer is disposed between the drive circuit layer and the emissive layer, and the planarization layer is a black light-absorbing layer.

14. The display apparatus according to claim 13, wherein the planarization layer is an infrared-transparent black light-absorbing layer.

15. The display apparatus according to claim 11, wherein the pixel define layer under the black light-shielding blocks is a discontinuous structure in the thickness direction of the organic light-emitting display panel.

16. The display apparatus according to claim 11, wherein in a plane perpendicular to the thickness direction of the organic light-emitting display panel, a minimum distance between an edge of the organic light-emitting unit and an edge of the corresponding region between adjacent black light-shielding blocks is a first distance, and the first distance is greater than 0.5 $\mu$m.

17. The display apparatus according to claim 16, wherein the plurality of organic light-emitting units comprise a green organic light-emitting unit, a blue organic light-emitting unit, and a red organic light-emitting unit; and the first distance corresponding to the green organic light-emitting unit is 3 $\mu$m, the first distance corresponding to the blue organic light-emitting unit is 1.5 $\mu$m, and the first distance corresponding to the red organic light-emitting unit is 5 $\mu$m.

18. The display apparatus according to claim 11, wherein the plurality of organic light-emitting units comprise a green organic light-emitting unit, a blue organic light-emitting unit, and a red organic light-emitting unit: the plurality of color-blocking blocks comprise a green color-blocking block, a blue color-blocking block, and a red color-blocking block; and the green organic light-emitting unit is disposed in a correspondence with the green color-blocking block, the blue organic light-emitting unit is disposed in a correspondence with the blue color-blocking block, and the red organic light-emitting unit is disposed in a correspondence with the red color-blocking block; and a full width at half maximum of an optical spectrum of the green color-blocking block is less than or equal to 70 nm, a full width at half maximum of an optical spectrum of the blue color-blocking block is greater than or equal to 60 nm and less than or equal to 100 nm, and a full width at half maximum corresponding to a short wavelength of an optical spectrum of the red color-blocking block is less than or equal to 25 nm.

19. The display apparatus according to claim 11, wherein the organic light-emitting display panel further comprises an encapsulation layer, a first planarization layer, a second planarization layer, and a coating planarization layer:

the encapsulation layer is disposed between the emissive layer and the first planarization layer, and comprises a first inorganic insulation layer, an organic insulation layer, and a second inorganic insulation layer: the organic insulation layer is disposed between the first inorganic insulation layer and the second inorganic insulation layer; and the second inorganic insulation layer is disposed on a side that is of the organic insulation layer and that is close to the first planarization layer;

at least one of the color-blocking block and the black light-shielding block is located between the first planarization layer and the second planarization layer, and the second planarization layer is disposed on a side that is of the first planarization layer and that is close to the coating planarization layer; and a refractive index of the second inorganic insulation layer, a refractive index of the first planarization layer, a refractive index of the second planarization layer, and a refractive index of the coating planarization layer sequentially decrease.

20. The display apparatus according to claim 19, wherein the refractive index of the second inorganic insulation layer is 1.8, the refractive index of the first planarization layer is 1.62, the refractive index of the second planarization layer is 1.55, and the refractive index of the coating planarization layer is 1.52.

* * * * *